(12) United States Patent
Fuwa et al.

(10) Patent No.: US 6,781,812 B2
(45) Date of Patent: Aug. 24, 2004

(54) CHUCK EQUIPMENT

(75) Inventors: Koh Fuwa, Kanagawa (JP); Ken Maehira, Kanagawa (JP)

(73) Assignee: Nihon Shinku Gijutsu Kabushiki Kaisha, Chigasaki (JP)

( * ) Notice: Subject to any disclaimer, the term of this patent is extended or adjusted under 35 U.S.C. 154(b) by 297 days.

(21) Appl. No.: 09/768,173

(22) Filed: Jan. 24, 2001

(65) Prior Publication Data

US 2002/0135967 A1 Sep. 26, 2002

(51) Int. Cl.$^7$ .............................................. H01T 23/00
(52) U.S. Cl. ...................................................... 361/234
(58) Field of Search ........................................ 361/234

(56) References Cited

U.S. PATENT DOCUMENTS

| | | | | |
|---|---|---|---|---|
| 5,103,367 A | * | 4/1992 | Horwitz et al. | 361/234 |
| 5,229,910 A | * | 7/1993 | Kasahara | 361/234 |
| 5,751,537 A | * | 5/1998 | Kumar et al. | 361/234 |
| 5,847,918 A | * | 12/1998 | Shufflebotham et al. | 361/234 |

FOREIGN PATENT DOCUMENTS

WO     WO 00/72376 A1    11/2000

* cited by examiner

*Primary Examiner*—Brian Sircus
*Assistant Examiner*—James Demakis
(74) *Attorney, Agent, or Firm*—Armstrong, Kratz, Quintos, Hanson & Brooks, LLP

(57) ABSTRACT

A chuck equipment which can hold insulating substrates is provided. First and second electrodes are provided to be exposed on the base the surface of which is insulated. The insulating substrate is placed in contact with or in close proximity to the surfaces of the first and second electrodes. Since an electric field having a high rate of spatial change is established between the first and second electrodes, the substrate is held against the surface of the chuck equipment by the gradient force. Since the magnitude of the gradient force depends on that of the rate of change of the electric field, a voltage may be applied between the first and second electrodes to establish an electric field of $1.0 \times 10^6$ V/m or greater.

11 Claims, 9 Drawing Sheets

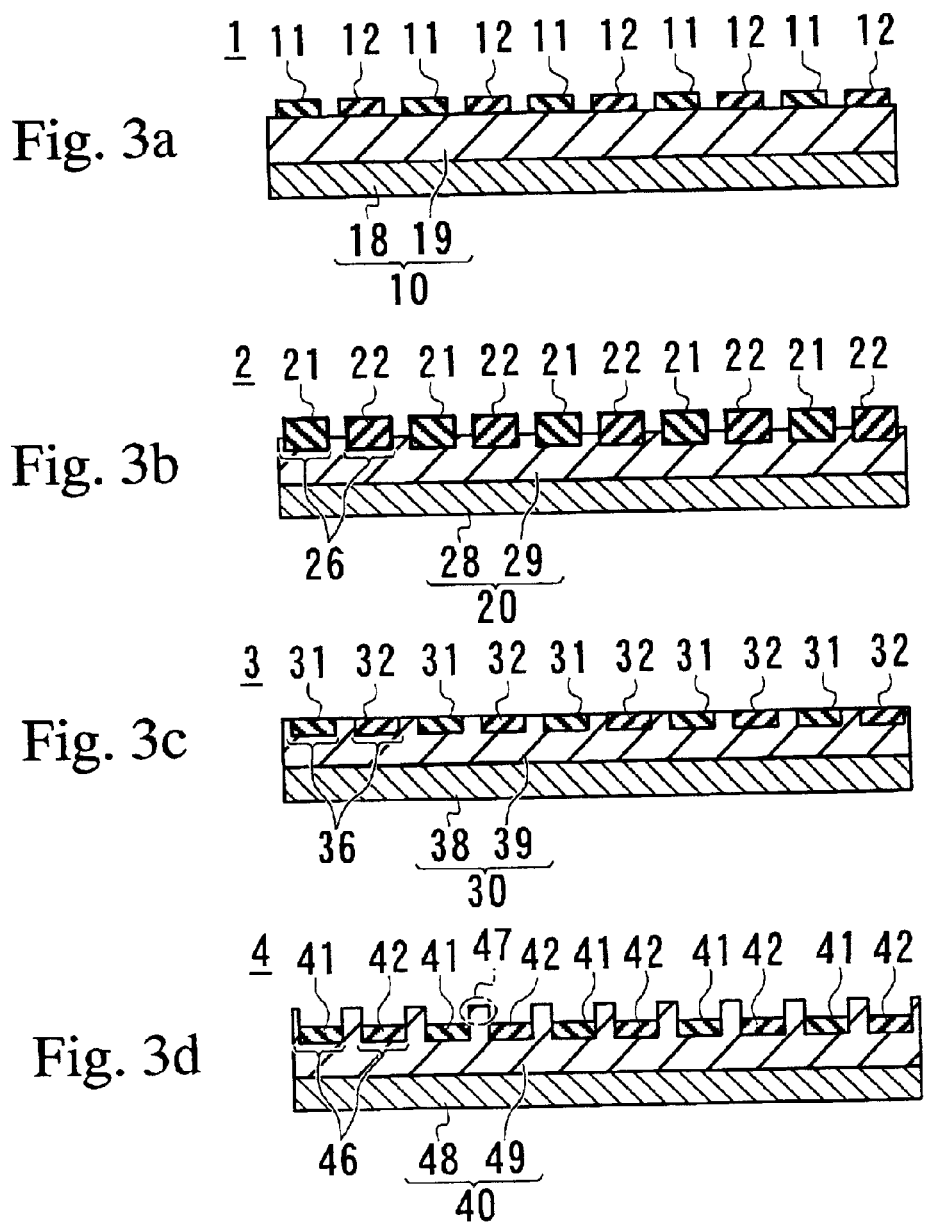

CHUCK EQUIPMENT

BACKGROUND OF THE INVENTION

1. Field of the Invention

The present invention relates to chuck equipments and more particularly to a chuck equipment which can hold insulating substrates.

2. Description of the Related Art

Conventionally, electrostatic chuck equipments have been used to hold substrates in vacuum apparatuses.

A sputtering apparatus, generally denoted at reference numeral 101 in FIG. 9(a), has a vacuum chamber 110. On the top side ceiling of the vacuum chamber 110, there is arranged a target 102. On the bottom wall side, there is arranged a chuck equipment 104.

The chuck equipment 104 comprises a dielectric layer 121 and a pair of electrodes $122_1$, $122_2$ embedded in said dielectric layer 121. The chuck equipment 104 also has holes, formed in the dielectric layer 121, and lift pins 106 are inserted into the holes from below.

The electrodes $122_1$, $122_2$ are each connected to a chuck equipment power supply 109 which is arranged outside the vacuum chamber 110.

When a substrate 112 is placed on the chuck equipment 104, the substrate 112 opposes in parallel to each of the electrodes $122_1$, $122_2$ via the dielectric layer 121, having a thickness of several tens to several hundreds of micrometers disposed between the substrate 112 and the electrodes $122_1$, $122_2$.

The substrate 112 such as a silicon or gallium arsenide wafer is electrical conductive. Therefore, when the substrate 112 is placed on the chuck equipment 104, and followed by the power supply 109 turned on, there will be formed a capacitor, designated at reference numeral $125_1$ in FIG. 9(b), between one of the electrodes $122_1$ and the substrate 112. There will also be formed another capacitor, designated at reference numeral $125_2$ in FIG. 9(b), between the other one of the electrodes $122_2$ and the substrate 112.

These two capacitors $125_1$, $125_2$ are connected to the power supply 109 in series with each other. Application of a positive voltage to the one electrode $122_1$ and a negative voltage to the other electrode $122_2$ would allow the capacitors $125_1$, $125_2$ to be electrically charged. This will cause an electrostatic pressure to be generated between the substrate 112 and the one electrode $122_1$ and between the substrate 112 and the other electrode $122_2$. The electrostatic attraction thus generated clamps the substrate 112 electrostatically on the surface of the chuck equipment 104.

With the substrate 112 being clamped electrostatically on the chuck equipment 104, the substrate 112 is in close contact with the chuck equipment 104. This provides higher heat conductivity between the substrate 112 and the chuck equipment 104, thereby making it possible to keep the substrate 112 at a desired temperature using a heating or cooling system equipped with the chuck equipment 104. Therefore, thin film deposition temperatures can be controlled with accuracy upon sputtering the target 102 to form a thin film on the surface of the substrate 112.

Upon completion of the formation of the thin film, the voltage applied to the electrodes $122_1$, $122_2$ is disconnected therefrom and the electrostatic clamping of the substrate 112 is released. The lift pins 106 are raised and the substrate 112 is lifted from the chuck equipment 104 and the substrate 112 transferred out of the vacuum chamber 110.

As described above, chuck equipment 104 of the prior-art is adapted to employ the substrate 112 as an electrode to form the capacitors $125_1$, $125_2$ between the substrate 112 and the electrodes $122_1$, $122_2$ embedded in the chuck equipment 104, thereby generating an electrostatic pressure. Therefore, it is necessary for the substrate 112 to have electrical conductivity so that the substrate can be electrostatically clamped by the chuck equipment 104.

However, it has been lately wanted to perform vacuum processing on glass substrates which constitute liquid crystal display devices or plasma display devices while the glass substrate is being electrostatically clamped on the chuck equipment.

Semiconductor substrates formed of a single crystal have electrical conductivity even with a high resistance, thus making it possible to generate an electrostatic pressure for clamping the substrate on the chuck equipment. However, glass substrates have too high insulation to form the capacitors shown in FIG. 9(b), thereby allowing the substrate not to be electrostatically clamped on the chuck equipment 104.

SUMMARY OF THE INVENTION

The present invention was developed to solve the aforementioned prior-art problems and an object thereof is to provide a chuck equipment which can hold insulating substrates.

The present invention is a chuck equipment comprising a plate-shaped base, a first electrode to which a first voltage is applied, and a second electrode to which a second voltage different from said first voltage in magnitude is applied, the first and second electrodes being insulated from each other and arranged on a surface of the base.

The present invention is the chuck equipment, in which surfaces of the first and second electrodes can be exposed.

The chuck equipment of the present invention is constructed in such a manner that a substrate may be placed on the surface of the chuck equipment on which the first and second electrodes are arranged to cause the substrate to be brought into contact with the first and second electrodes.

The chuck equipment of the present invention is characterized in that the surface of the base is even with the surfaces of the first and second electrodes.

According to the chuck equipment of the present invention, an insulating convexity portion can be arranged between the first and second electrodes.

According to the chuck equipment of the present invention, the first and second electrodes can have a protective film arranged on the surfaces thereof.

The chuck equipment of the present invention may be constructed in such a manner that a substrate may be placed on the surface of the chuck equipment on which the first and second electrodes are arranged to cause the substrate to be brought into contact with the protective film formed on the first and second electrodes.

According to the chuck equipment of the present invention, the first electrode can be spaced apart from the second electrode by 2 mm or less.

According to the chuck equipment of the present invention, the first and second electrodes can be made 4 mm or less in width.

The chuck equipment according to the present invention may comprise a plurality of the first and second electrodes arranged thereon, and regions where the first and second electrodes are alternately arranged.

The chuck equipment according to the present invention may have a third electrode to which a third voltage different from first and second voltages is applied.

Furthermore, the present invention also provides a vacuum processing apparatus comprising a vacuum chamber in which the above-described chuck equipment of the present invention is arranged.

The vacuum processing apparatus according to the present invention may comprise a power supply for establishing an electric field of $1.0 \times 10^6$ V/m or greater between the first and second electrodes.

According to the vacuum processing apparatus of the present invention, a protective plate may be arranged around the chuck equipment, and a substrate may be placed on the chuck equipment to cause the substrate to be accommodated in the protective plate.

BRIEF DESCRIPTION OF DRAWINGS

FIG. 3(a) is a schematic cross-sectional view illustrating the chuck equipment according to the first embodiment of the present invention;

FIG. 3(b) is a schematic cross-sectional view illustrating a chuck equipment according to a second embodiment of the present invention;

FIG. 3(c) is a schematic cross-sectional view illustrating a chuck equipment according to a third embodiment of the present invention; and FIG. 3(d) is a schematic cross-sectional view illustrating a chuck equipment according to a fourth embodiment of the present invention.

DETAILED DESCRIPTION OF THE PREFERRED EMBODIMENTS

As described above, since the prior-art chuck equipment electrostatically holds substrates such as silicon wafers having electrical conductivity, an insulating material with a high dielectric constant such as $Al_2O_3$, AlN, SiC, polyimide, or silicone rubber is disposed between the electrodes and the substrate (otherwise, the electrodes would be short-circuited therebetween without the insulating materials).

Accordingly, between the substrate and the electrodes, the capacitors are formed to cause Coulombic forces to be developed. A electrostatic pressure F developed by the Coulombic force per unit area can be expressed by the following equation.

$$F = \tfrac{1}{2} \cdot a \cdot (V/d)^2$$

where "a" is a coefficient dependent on the dielectric constant and surface condition of the insulating material, "d" is the distance between the substrate and an electrode (which, in more detail, means the thickness of the insulating material or the gap between the substrate and the surface of the electrostatic chuck equipment), and "V" is the voltage applied between the electrode and the substrate.

However, with an insulating substrate such as a piece of glass, no capacitor is formed between the substrate and the electrodes, thus creating no electrostatic electrostatic pressure F developed by the aforementioned Coulombic force.

On the other hand, it is known that an insulating substance of polarizability α being placed in an electric field E is acted upon by a gradient force f per unit volume as follows.

$$f = \tfrac{1}{2} \cdot \alpha \cdot \mathrm{grad}(E^2)$$

The inventors of the present invention focused attention on the gradient force f, thereby leading to the invention of a chuck equipment which was able to hold even insulating substrates.

In the foregoing, it holds for the dielectric (insulating substances) that α>0. According to the above equation, the insulating substrate is therefore to be attracted toward a stronger electric field.

Figure 8:
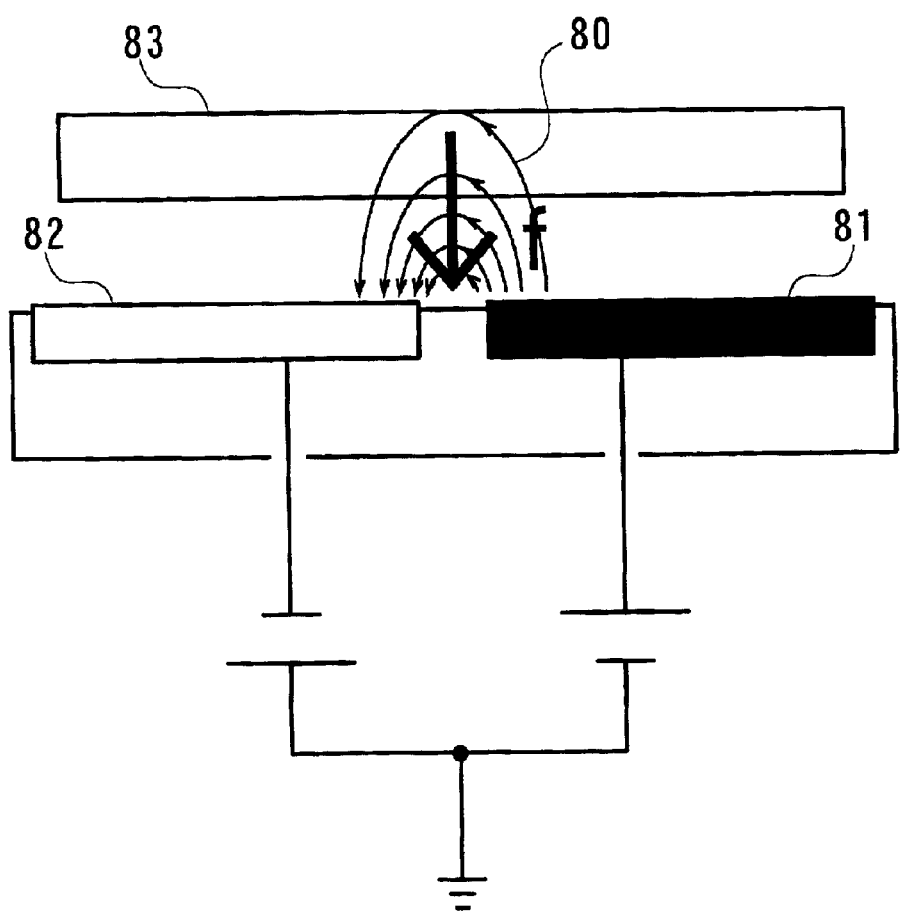
FIG. 8 is an explanatory view illustrating the gradient force.
Figure 9A:
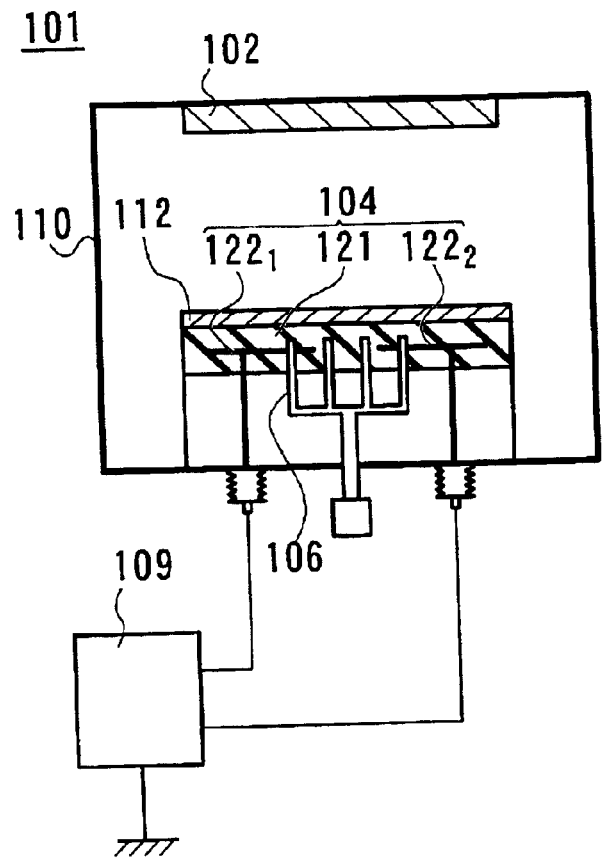
FIGS. 9(a) and 9(b) are explanatory views illustrating a prior art chuck equipment.
Figure 9B:
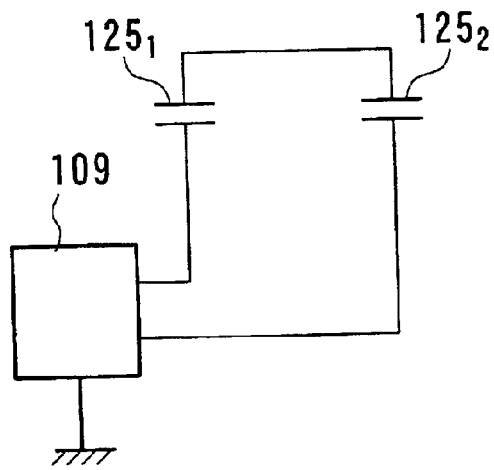

Referring to FIG. 8, reference numeral 80 designates an electric field established between electrodes 81 and 82, to which a positive and negative voltage is applied with respect to a substrate 83. The electric field is stronger in the vicinity of electrodes 81, 82 and weaker away from them, thus causing a force f to act upon the substrate 83 toward the electrodes 81, 82.

Furthermore, according to the above equation, a greater gradient force f acts on the substrate having a greater grad $(E^2)$. Thus, the greater the rate of spatial change in E, the greater the gradient force f becomes. Therefore, an arrangement of the electrodes is considered that the rate of change in electric field becomes lower in the vicinity of the substrate and higher in the vicinity of the electrodes. Such an arrangement allows the substrate 83 to be acted upon by a greater gradient force f.

More specifically, in a case where the potential of the vacuum chamber in which the chuck equipment is disposed is made zero (at the ground potential), an electrode to which a positive voltage is applied and an electrode to which a negative voltage is applied may be disposed in close proximity to each other.

In addition, taking the electric field established between the electrodes into consideration, with a dielectric being disposed in the vicinity of the electrodes, the electric flux is trapped in the dielectric (of relative dielectric constant ϵr>1). Therefore, the dielectric disposed between the electrodes of the chuck equipment and the substrate would cause the electric lines of force to be readily trapped into the dielectric. Consequently, the electric field (the density of electric lines of force) will be made weaker than in a vacuum between the substrate and the electrodes.

Therefore, contrary to this, such a configuration with no dielectric being disposed on the electrodes would allow the grad ($E^2$) to become greater, thereby making it possible to provide a greater electrostatic pressure (gradient force f).

The electrostatic pressures acting upon the insulating substrate 83 were measured with the dielectric layer being disposed and with the dielectric layer being not disposed on the electrodes 81, 82 to which the positive and negative voltages are applied as shown in FIG. 8.

The electrodes 81, 82 are 4 mm in width, the distance between the electrodes 81 and 82 is 1 mm, and the holding area is 8 inches in diameter. The dielectric employed for comparison is a ceramic comprising $Al_2O_3$ as a main ingredient, a thickness of 500 micrometers, and a volume resistivity of approximately $10^{11}$ $\Omega \cdot cm$.

A target to be held is a substrate formed of transparent quartz glass having a thickness of 5 mm, diameter of 8 inches, a volume resistivity $10 \times 10^{18}$ $\Omega \cdot cm$, and a relative dielectric constant 3.70 (0 to 1 MHz).

The measurements of the electrostatic pressure are shown in Table 1 below. When no dielectric is interposed between the substrate and the electrodes 81, 82, the electrostatic pressure increases by approximately 1.5 times.

TABLE 1

Result of measurements of the electrostatic pressure

| Applied voltage (v) | Electrostatic pressure (gf/cm²) | |
| --- | --- | --- |
| | With dielectric layer | No dielectric layer |
| 3000 | 150 | 230 |
| 5000 | 300 | 450 |
| 8000 | 360 | 520 |

The base employed for the chuck equipment according to the present invention may be formed of an insulating plate, or a metal plate on which an insulating film is formed with a first and second electrode arranged on the insulating film. The insulating film may be formed of a material such as aluminum oxide, aluminum nitride, silicon carbide, SIALON, diamond, polyimide, and silicone rubber.

In a case where the vacuum chamber for accommodating the chuck equipment therein is connected to the ground potential, the power supply for applying voltages to the first and second electrodes may be adapted to apply a positive voltage to any one of the first and second electrodes and a negative voltage to the other electrode.

Figure 1A:
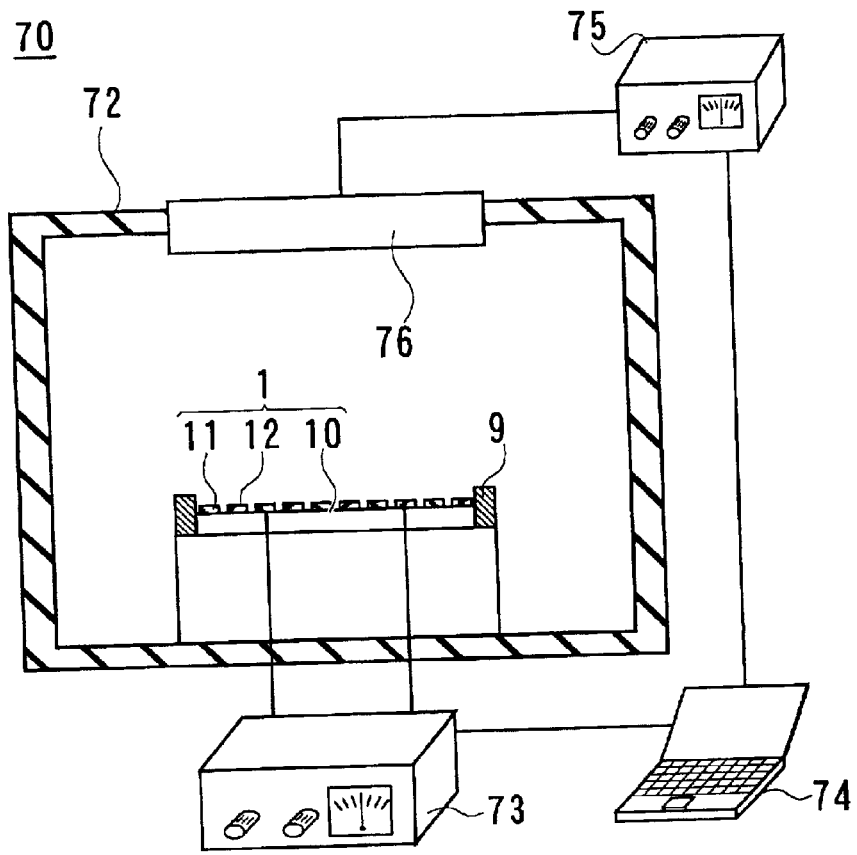
FIG. 1(a) is a view illustrating a vacuum processing apparatus according to an embodiment of the present invention.

Now, an embodiment of a vacuum processing apparatus according to the present invention is shown in FIG. 1(a), which is generally denoted at reference numeral 70.

The vacuum processing apparatus 70 comprises a vacuum chamber 72, a chuck equipment power supply 73, a sputter power supply 75, and a controller (computer) 74 for use with the chuck equipment power supply 73 and the sputter power supply 75.

Figure 2A:
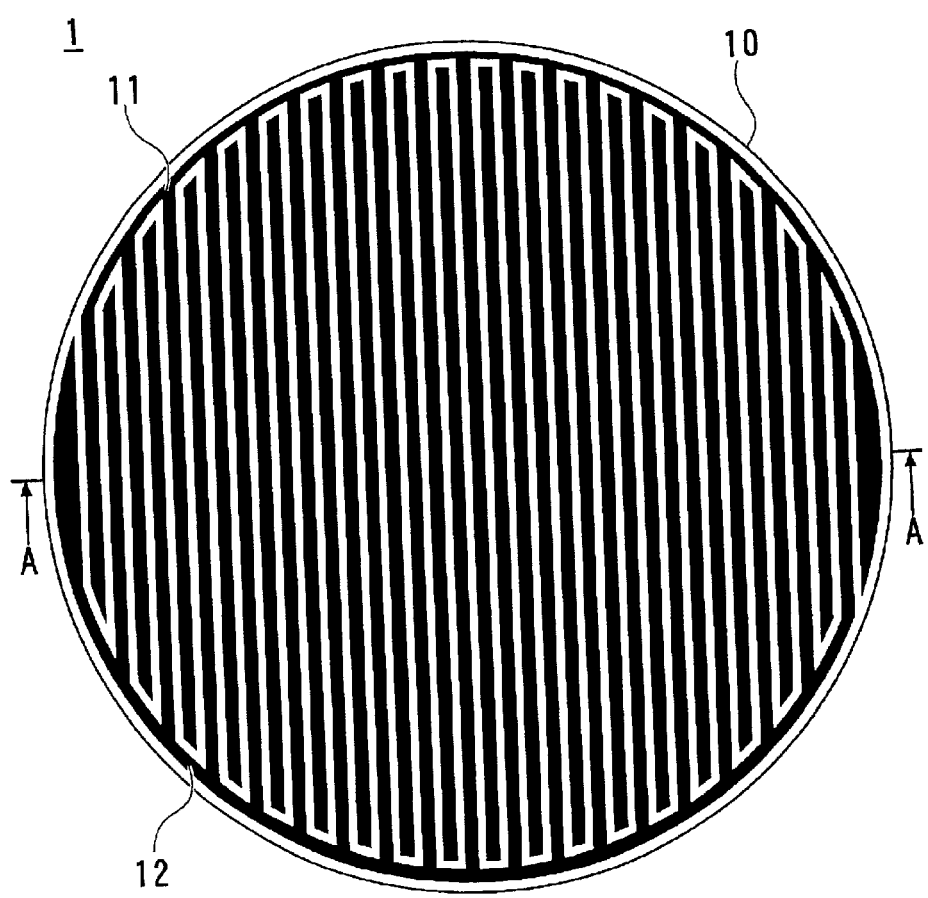
FIG. 2(a) is a view illustrating the arrangement of electrodes of the chuck equipment according to a first embodiment of the present invention.
Figure 2:
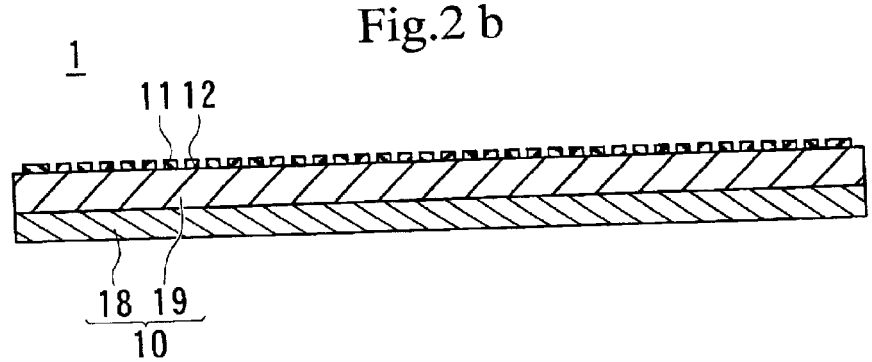
FIG. 2(b) is a cross-sectional view of the chuck equipment.

Inside the vacuum chamber 72, there are arranged a sputtering target 76 and a chuck equipment 1 according to a first embodiment of the present invention. FIG. 2(a) is a plane view illustrating the chuck equipment 1 and FIG. 2(b) is a cross-sectional view taken along line A—A of FIG. 2(a).

The chuck equipment 1 has a plate-shaped base 10. The base 10 comprises a metal plate 18 and an insulator 19 arranged on a surface of the metal plate 18. The insulator 19 is formed of a layer of insulating ceramic such as aluminum oxide. On a surface of the insulator 19, there are provided first and second electrodes 11, 12 formed of a conductive carbon material. Accordingly, the surfaces of the first and second electrodes 11, 12 protrude from the surface of the base 10.

The first and second electrodes 11, 12 are patterned in a comb-shaped configuration, being so arranged as to allow the teeth of the comb to mate in non-contact with each other.

The base 10 is 8 inches in diameter, the first and second electrodes 11, 12 are 4 mm in width, and the distance between the electrodes is 1 mm.

In a case where vacuum processing treatments are performed using the vacuum processing apparatus 70 configured as such, the vacuum chamber 72 is first pumped down to a vacuum and then a substrate is transferred into the vacuum chamber 72 using a substrate transfer mechanism (not shown) to allow the substrate to be placed on the surface of the chuck equipment 1.

Figure 1B:
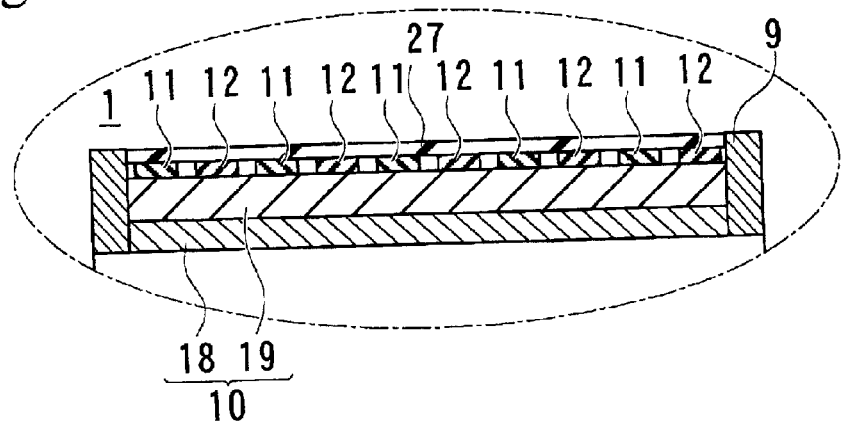
FIG. 1(b) is an enlarged view illustrating part of a chuck equipment according to the present invention.

FIG. 1(b) is an enlarged view of part of the chuck equipment 1, reference numeral 27 designating an insulating substrate placed on the chuck equipment 1.

The placement of the insulating substrate 27 on the chuck equipment 1 allows the back surface of the substrate 27 to be brought into contact with the surfaces of the first and second electrodes. Under this condition, the back surface of the substrate 27 is spaced apart from the surface of the insulator 19, thus forming a gap therebetween.

There is arranged an annular protective plate 9 around the chuck equipment 1. The placement of the substrate 27 on the chuck equipment 1 causes the outer peripheral portion of the substrate 27 to be brought into contact with the inner peripheral surface of the protective plate 9. Moreover, the gap formed between the back surface of the substrate 27 and the insulator 19 is sealed with the protective plate 9.

An electric field is established between the first and second electrodes 11, 12 when the chuck equipment power supply 73 is connected to the first and second electrodes 11, 12, the chuck equipment power supply 73 is activated, and one of the first and second electrodes 11, 12 is connected to a negative voltage and the other to a positive voltage.

Figure 5:
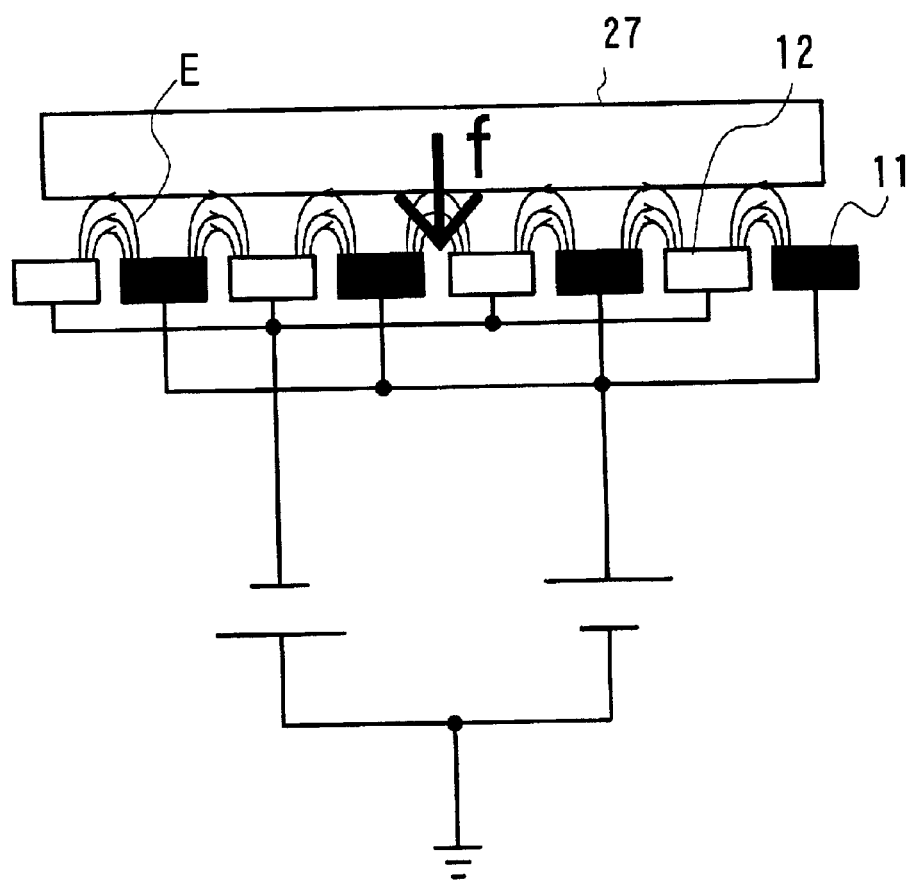
FIG. 5 is an explanatory view illustrating the electrostatic pressure of the chuck equipment according to the present invention.

FIG. 5 is a schematic view illustrating an electric field E established between the substrate 27 and the first and second electrodes 11, 12 and a force f acting upon the substrate 27 in a case where a positive voltage is applied to the first electrode 11 and a negative voltage to the second electrode 12. Since the substrate 27 has a high insulation, almost no current flows between the first and second electrodes 11, 12.

When a sputtering gas is introduced into the vacuum chamber 72, the sputter power supply 75 is activated, and a high voltage is applied to the sputtering target with the substrate 27 being held against the chuck equipment 1, a plasma is formed near the surface of the sputtering target to initiate sputtering.

Since the substrate 27 is held against the chuck equipment 1 and thus a high thermal conductivity is available between the substrate 27 and the chuck equipment 1, a heater or a cooling apparatus provided inside the base 10 or on the back surface of the base 10 would make it possible to form a thin film while the temperature of the substrate 27 is being well controlled.

In addition, the protective plate 9 provided around the substrate 27 will prevent the plasma formed in the vacuum chamber 72 at the time of sputtering from going into the gap between the back surface of the substrate 27 and the base 10. Thus, no plasma will be present between the first electrode 11 and the second electrode 12, never developing a short-circuit between the first and second electrodes by plasma.

FIG. 3(a) is a schematic cross-sectional view illustrating the chuck equipment 1 according to the first embodiment.

The chuck equipment 1 has the first and second electrodes 11, 12 formed on the insulator 19, and thus the surfaces of the first and second electrodes 11, 12 are higher than the surface of the insulator 19.

FIGS. 3(b) to (d) illustrate chuck equipments 2 to 4 according to second to fourth embodiments, respectively.

The chuck equipments 2 to 4 according to the second to fourth embodiments have metal plates 28, 38, 48, respectively.

There is arranged an insulator 29, 39, 49 on each metal plate 28, 38, 48. On the surface of the insulator 29, 39, 49, there is formed a concavity portion 26, 36, 46 such that the bottom portion thereof will not reach the metal plate 28, 38, 48.

Inside the concavity portion 26, 36, 46 of each insulator 29, 39, 49, there are arranged first and second electrodes 21, 22, 31, 32, 41, 42 being insulated from each other. The lower end portions of the first and second electrodes 21, 22, 31, 32, 41, 42 are arranged on the bottom portions of each concavity portion 26, 36, 46.

In the chuck equipment 2 according to the second embodiment shown in FIG. 3(b), the upper end portions of the first and second electrodes 21, 22 protrude from the insulator 29.

Like the chuck equipment 1 according to the first embodiment, in the chuck equipment 2 according to the second embodiment, when the substrate is held against the chuck equipment 2, the back surface of the substrate is placed onto the upper end portions of the first and second electrodes 21, 22 and a gap will also be formed between the back surface of the substrate and the insulator 29.

In the chuck equipment 3 according to the third embodiment shown in FIG. 3(c), the upper end portions of the first and second electrodes 31, 32 are formed flush with the surface of the insulator 39. That is, the surface of the insulator 39 is formed flush with the upper end portions of the first and second electrodes 31, 32. When a substrate is held against the chuck equipment 3, the back surface of the substrate is brought into contact with the surfaces of the first and second electrodes 31, 32 and the insulator 39.

In the chuck equipment 4 according to the fourth embodiment shown in FIG. 3(d), the upper end portions of the first and second electrodes 41, 42 are formed below the surface of the insulator 49. That is, the upper end portions of the first and second electrodes 41, 42 are located a little below the surface of the concavity portion 46, and a convexity portion 47 formed of the surface portion of the insulator 49 is formed between the first and second electrodes 41, 42.

In the chuck equipment 4, when a substrate is held against the surface thereof, the back surface of the substrate is brought into contact with the upper end portions of the convexity portion 47 but not brought into contact with the first and second electrodes 41, 42.

Thus, the first and second electrodes 41, 42 are provided with prolonged life since the substrate is brought into contact with the surface of the insulator 49 having high wear resistance but not brought into contact with the first and second electrodes 41, 42 of comparatively low wear resistance.

However, to prevent the electrostatic pressure from being decreased, it is desirable for the convexity portion 47 to protrude 500 micrometers or less from the surfaces of the first and second electrodes 41, 42.

In addition, a protective film may be formed on the surfaces of the first and second electrodes 11, 21, 31, 41, 12, 22, 32, 42 to provide the electrodes with prolonged life in the first to third embodiments of chuck equipments 1 to 3 where the surfaces of the electrodes can be brought into contact with the back surface of the substrate and even in the chuck equipment 4 according to the fourth embodiment. To prevent the electrostatic pressure from being decreased, the protective film is several tens to several hundreds of micrometers in thickness and preferably 500 micrometers or less in thickness.

Figure 4A:
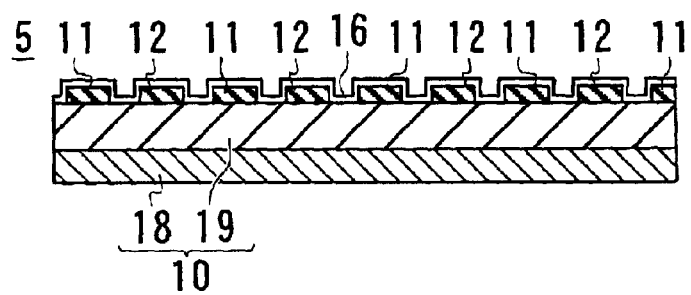
FIG. 4(a) is a cross-sectional view illustrating a chuck equipment in which an insulating protective film is formed on the surface of the chuck equipment according to the first embodiment of the present invention.

FIG. 4(a) is a view illustrating a chuck equipment 5 in which a protective film 16 formed of an insulating thin film such as a silicon oxide film is formed on the surface of the chuck equipment 1 according to the first embodiment. The chuck equipment 5 allows the substrate 27 to be brought into contact with the protective film 16. The protective film 16 covers the first and second electrodes 11, 12 and the surface of the insulator 19 exposed therebetween, however, no short-circuit is developed between the first and second electrodes 11, 12 due to the insulating property of the protective film 16.

On the other hand, in a case where the protective film is conductive, the conductive protective film may be allowed to cover only the upper surfaces of the first and second electrodes or the protective film may be formed so as not to short-circuit the both electrodes. In this case, the first and second electrodes would function as if they were exposed.

Figure 4B:
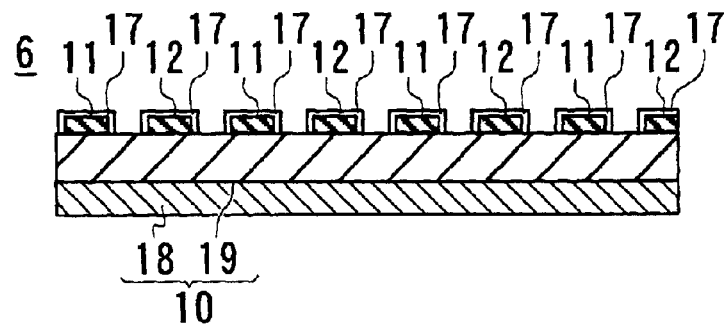
FIG. 4(b) is a cross-sectional view illustrating a chuck equipment in which a conductive protective film is formed on the surface of and around the first and second electrodes of the chuck equipment according to the first embodiment of the present invention.

FIG. 4(b) is a view illustrating a chuck equipment 6 in which a conductive protective film 17 is arranged on the surfaces of and around the first and second electrodes 11, 12 of the chuck equipment 1 according to the first embodiment. The original first and second electrodes 11, 12 and the protective film 17 combine electrically with each other, so that the protective film 17 play the electrodes. Since the conductive protective film 17 is not arranged on the surface of the insulator 19, no short-circuit is developed by the protective film 17 between the first and second electrodes 11, 12.

Figure 4C:
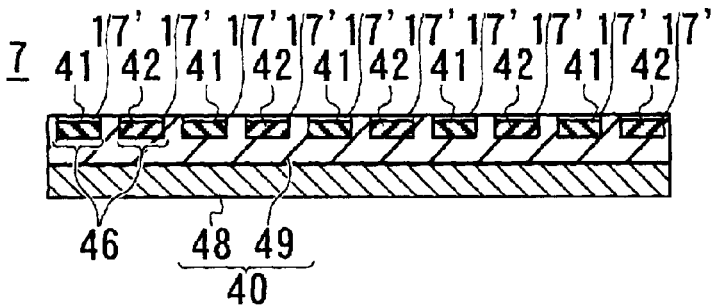
FIG. 4(c) is a cross-sectional view illustrating a chuck equipment in which a conductive protective film is arranged on the surface of a chuck equipment according to the fourth embodiment of the present invention.

FIG. 4(c) is a view illustrating a chuck equipment 7 in which a conductive protective film 17' is formed on the surfaces of the first and second electrodes 41, 42 in the chuck equipment 4 according to the fourth embodiment. In the chuck equipment 7, the upper surfaces of the fourth embodiment of first and second electrodes 41, 42 are located below the surface of the insulator 49, same as the chuck equipment of fourth embodiment. In the chuck equipment 7, the conductive protective film 17' is formed on the surface of the first and second electrodes 41, 42. The surface of the conductive protective film 17' is flush with the surface of the insulator 49 but no short-circuit is developed between the first and second electrode 41, 42.

Incidentally, the aforementioned protective films 16, 17 can be formed by PVD, CVD, or ion implantation. The protective films 16, 17 are preferably 500 micrometers or less in thickness to prevent the electrostatic pressure thereof from being decreased.

The chuck equipments 1 to 4 according to the first to fourth embodiments have the electrodes patterned in a comb configuration, however, the chuck equipment according to the present invention is not limited thereto.

The chuck equipments 1 to 4 according to the first to fourth embodiments can also employ the electrode configurations shown in FIGS. 6(a) to 6(c) and FIGS. 7(d) and 7(e).

Figure 6A:
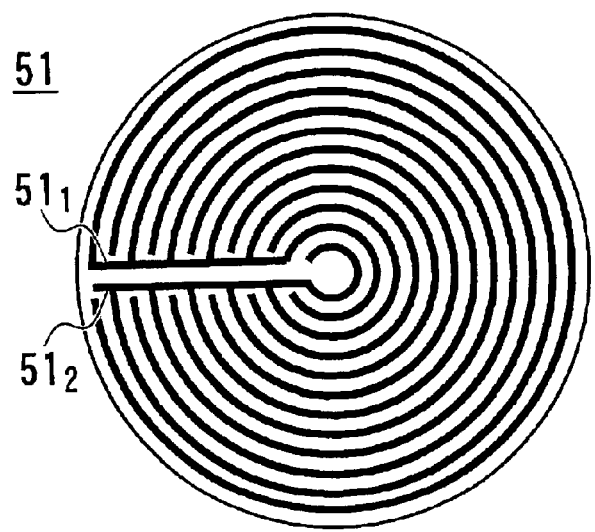
FIGS. 6(a) to 6(c) are views illustrating embodiments of electrode arrangements employed by the chuck equipment according to the present invention.

A chuck equipment 51 shown in FIG. 6(a) has comb-shaped first and second electrodes $51_1$, $51_2$, the comb teeth of which are arranged concentrically.

Figure 6B:
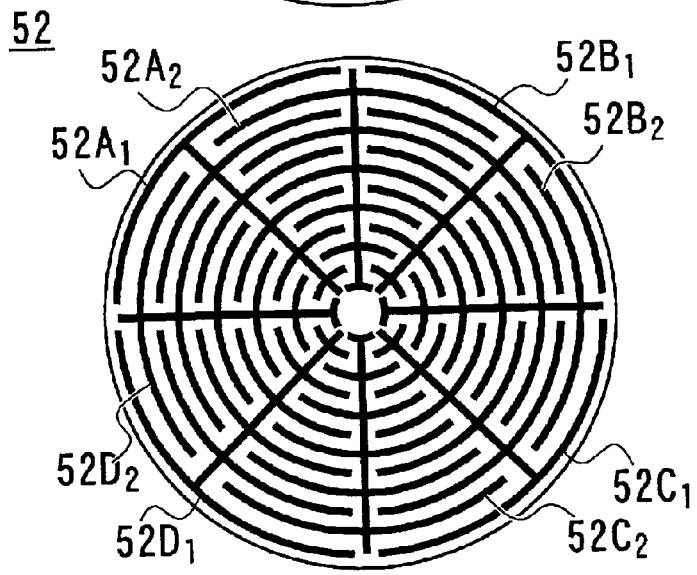

A Chuck equipment 52 shown in FIG. 6(b) has eight comb-shaped electrode $52A_1$, $52A_2$, $52B_1$, $52B_2$, $52C_1$, $52C_2$, $52D_1$, $52D_2$ which are divided into first four electrodes $52A_1$, $52B_1$, $52C_1$, $52D_1$ to which the same voltage is applied. A voltage of same magnitude is applied to second four electrodes $52A_2$, $52B_2$, $52C_2$, $52D_2$ but the voltage of magnitude applying to second four electrodes $52A_2$, $52B_2$, $52C_2$, $52D_2$ is different from the voltage applying to first four electrodes $52A_1$, $52B_1$, $52C_1$, $52D_1$. A case in which same absolute value of voltage but the different polarity is included in the case of different magnitude of voltage between first and second electrodes. A case in which one of the first and second electrodes is kept at the ground potential, and positive or negative voltage apply to the other electrode is also included in the above-described case of different magnitude of voltage.

The first four electrodes $52A_1$, $52B_1$, $52C_1$, $52D_1$ and the second four electrodes $52A_2$, $52B_2$, $52C_2$, $52D_2$ are patterned in a comb configuration with the teeth portion thereof being concentrically formed. The teeth portions of first four electrodes $52A_1$, $52B_1$, $52C_1$, $52D_1$ and the second four electrodes $52A_2$, $52B_2$, $52C_2$, $52D_2$ are alternately arranged so as to mate in non-contact with one another. These four pairs of electrodes may be applied with voltages of different magnitudes as necessary.

Figure 6C:
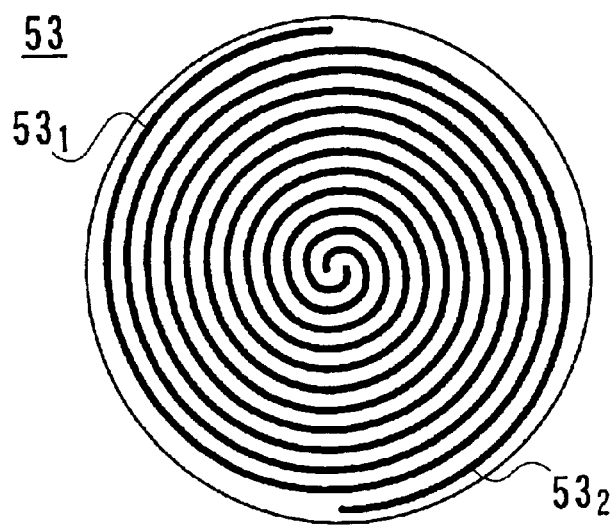

A chuck equipment 53 shown in FIG. 6(c) is provided with the first and second electrodes $53_1$, $53_2$ arranged in a double spiral fashion.

Figure 7D:
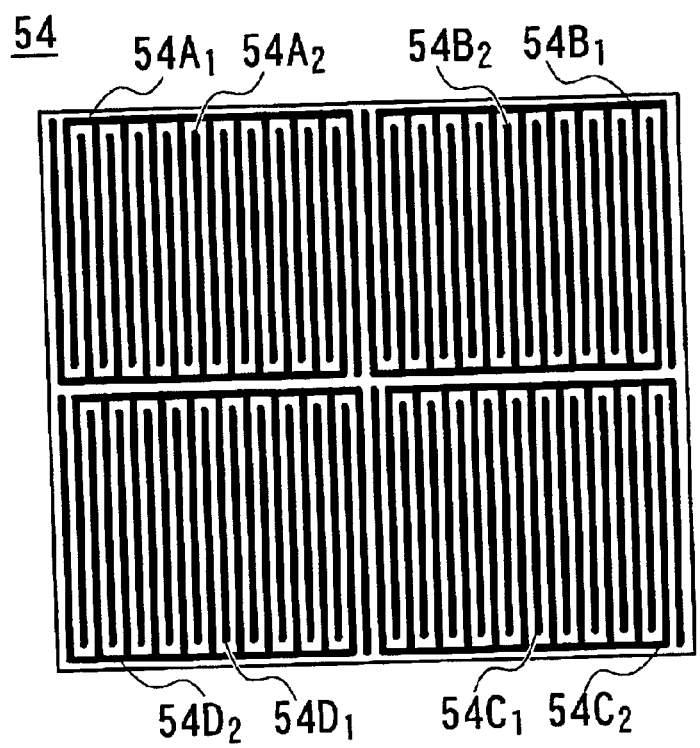
FIGS. 7(d) and 7(e) are views illustrating other embodiments of electrode arrangements employed by the chuck equipment according to the present invention.

Now, a chuck equipment 54 shown in FIG. 7(d) has a surface divided into four regions. On each of the regions, there is arranged a pair of first electrodes $54A_1$, $54B_1$, $54C_1$, $54D_1$, patterned in a comb configuration, and second electrodes $54A_2$, $54B_2$, $54C_2$, $54D_2$, also patterned in a comb configuration. The teeth of the comb of the first electrodes $54A_1$, $54B_1$, $54C_1$, $54D_1$ and the second electrodes $54A_2$, $54B_2$, $54C_2$, $54D_2$ are adapted to mate with each other.

In the chuck equipment 54, first four electrodes $54A_1$, $54B_1$, $54C_1$, $54D_1$ are applied the same voltage. A voltage of same magnitude is applied to second four electrodes $54A_2$, $54B_2$, $54C_2$, $54D_2$ but the voltage of magnitude applying to second four electrodes $54A_2$, $54B_2$, $54C_2$, $54D_2$ is different from the voltage applying to first four electrodes $54A_1$, $54B_1$, $54C_1$, $54D_1$. A case in which same absolute value of voltage but the different polarity is included in the case of different magnitude of voltage between first and second electrodes. A case in which one of the first and second electrodes is kept at the ground potential, and positive or negative voltage apply to the other electrode is also included in the above-described case of different magnitude of voltage. The voltages applied to the four pairs of electrodes can be changed as necessary to provide a higher voltage to the portion whose electrostatic pressure is desirably increased.

Figure 7E:
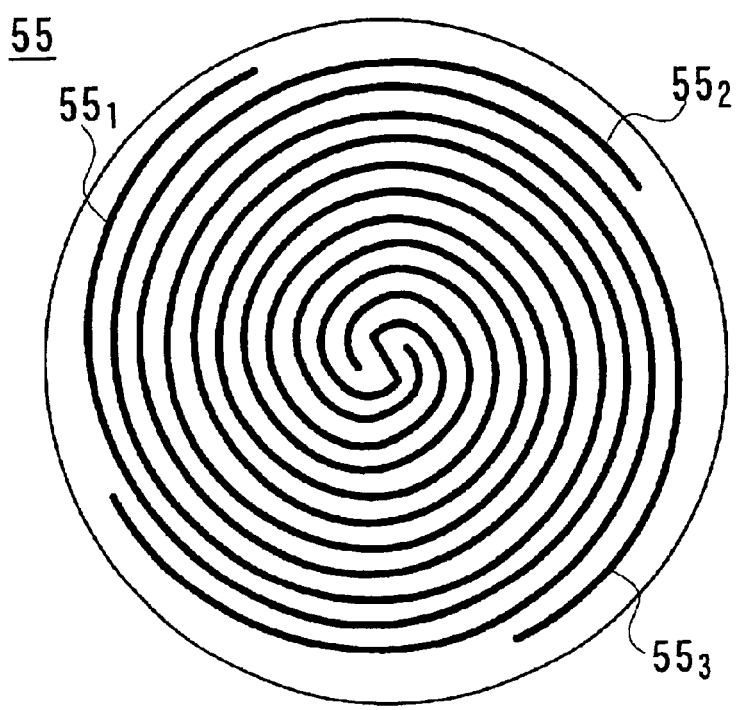

In a chuck equipment 55 shown in FIG. 7(e), there are arranged, in a four-fold spiral fashion, first to third electrodes $55_1$ to $55_3$ to which voltages different from one another are applied. For example, in the chuck equipment 55 with the electrodes being 2 mm spaced apart from each other, a voltage of 6000V is applied to the first electrode $55_1$, a voltage of 0V to the second electrode $55_2$, and a voltage of −6000V to the third electrode $55_3$ to establish approximately an electric field of $1.0 \times 10^6$ V/m between the electrodes.

Incidentally, the aforementioned vacuum processing apparatus 70 is a sputtering apparatus. However, the electrostatic chuck equipment 1 to 4 according to the present invention can be widely used in vacuum processing apparatuses such as a CVD apparatus, an etching apparatus, or an ion implantation apparatus for performing vacuum processing on target objects in a vacuum.

In addition, in the chuck equipments 1 to 4 and 51 to 55 of the present invention, the intensity of the electric field formed between the first and second electrodes may be made high enough but not so high as to cause a dielectric breakdown to occur. The electric field is preferably $3 \times 10^6$ V/m or higher in intensity.

Although bipolar-type chuck equipment in the foregoing embodiments, the present invention is not limited to such embodiments.

As described above, according to the present invention insulating substrates can be electrostatically held in a vacuum atmosphere on to the surface of chuck equipment.

What is claimed is:

1. A chuck equipment comprising
a plate-shaped base,
a first electrode to which a first voltage is applied, and
a second electrode to which a second voltage different from the first voltage in magnitude is applied, the first and second electrodes being insulated from each other and arranged on a surface of said base, said first and second electrodes having a substrate thereabove and said substrate is disposed in an electric field formed between said first and second electrodes, when said first and second voltages are applied, for holding said substrate onto said first and second electrodes,
wherein said surfaces of said first and second electrodes are exposed,
wherein the chuck equipment is constructed in such a manner that said substrate is placed on the surface of said chuck equipment on which said first and second electrodes are arranged to cause said substrate to be brought into contact with said first and second electrodes.

2. The chuck equipment according to claim 1, wherein the surface of said base is flush with the surfaces of said first and second electrodes.

3. The chuck equipment according to claim 1, wherein an insulating convexity portion is arranged between said first and second electrodes.

4. The chuck equipment according to claim 1, wherein said first and second electrodes have a protective film on the surfaces thereof and said protective film is exposed.

5. The chuck equipment according to claim 1, wherein said first electrode is spaced apart from said second electrode by 2 mm or less.

6. The chuck equipment according to claim 1, wherein said first and second electrodes are 4 mm or less in width.

7. The chuck equipment according to claim 1, comprising a plurality of said first and second electrodes arranged thereon, wherein region where said first and second electrodes are alternately arranged is provided.

8. The chuck equipment according to claim 1, comprising a third electrode to which a third voltage different from said first and second voltages is applied.

9. A vacuum processing apparatus comprising a vacuum chamber in which the chuck equipment according to claim 1 is arranged.

10. The vacuum processing apparatus according to claim 9, comprising a power supply for establishing an electric field of $1.0 \times 10^6$ V/m or greater between said first and second electrodes.

11. The vacuum processing apparatus according to claim 10, wherein a protective plate is arranged around said chuck equipment, and the vacuum processing apparatus is constructed in such a manner that a substrate is placed on said chuck equipment to cause said substrate to be accommodated in said protective plate.

* * * * *